(12) United States Patent
Lin

(10) Patent No.: US 8,604,834 B2
(45) Date of Patent: Dec. 10, 2013

(54) RECEIVED SIGNAL STRENGTH INDICATOR AND METHOD THEREOF

(75) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 461 days.

(21) Appl. No.: 12/861,020

(22) Filed: Aug. 23, 2010

(65) Prior Publication Data

US 2012/0043959 A1 Feb. 23, 2012

(51) Int. Cl.
*H03K 19/20* (2006.01)

(52) U.S. Cl.
USPC .......................................................... 326/113

(58) Field of Classification Search
USPC .................... 326/82–87, 112–113, 26, 30
See application file for complete search history.

(56) References Cited

U.S. PATENT DOCUMENTS

| | | | | |
|---|---|---|---|---|
| 5,694,065 A | * | 12/1997 | Hamasaki et al. | 327/108 |
| 7,924,066 B2 | * | 4/2011 | Gagne et al. | 327/108 |

* cited by examiner

*Primary Examiner* — Thienvu Tran
(74) *Attorney, Agent, or Firm* — McClure, Qualey & Rodack, LLP

(57) ABSTRACT

An apparatus includes a PMOS (p-channel metal-oxide semiconductor) transistor, a NMOS (n-channel metal-oxide semiconductor) transistor, a first capacitor, and a second capacitor, wherein: a first terminal of the PMOS transistor is coupled to a first signal; a second terminal of the PMOS transistor is coupled to a second signal; a third terminal of the PMOS transistor is coupled to the first capacitor; a first terminal of the NMOS transistor is coupled to the second signal; a second terminal of NMOS transistor is coupled to the first signal; and a third terminal of the NMOS transistor is coupled to the second capacitor.

20 Claims, 3 Drawing Sheets

RECEIVED SIGNAL STRENGTH INDICATOR AND METHOD THEREOF

BACKGROUND OF THE INVENTION

1. Field of the Invention

This disclosure generally relates to received signal strength indicators and more particularly to systems and methods for received signal strength indicators for signals having small amplitudes.

2. Discussion of the Related Art

A received signal strength indicator (RSSI) is a measurement of the power present in a received signal of a communication receiver. In practice, the received signal is usually an AC (alternating current) signal. To detect the power present in an AC signal, a rectification circuit is needed. Rectification is the conversion of an AC signal into a DC (direct current) signal. As is known, the power of a DC signal can be conveniently measured. In prior art systems, rectification is usually accomplished by using a diode circuit. However, a diode has an inherent non-zero threshold voltage (which is typically 0.6V) and therefore a diode circuit cannot rectify a small AC signal whose amplitude is below its threshold voltage.

SUMMARY

Figure 1:
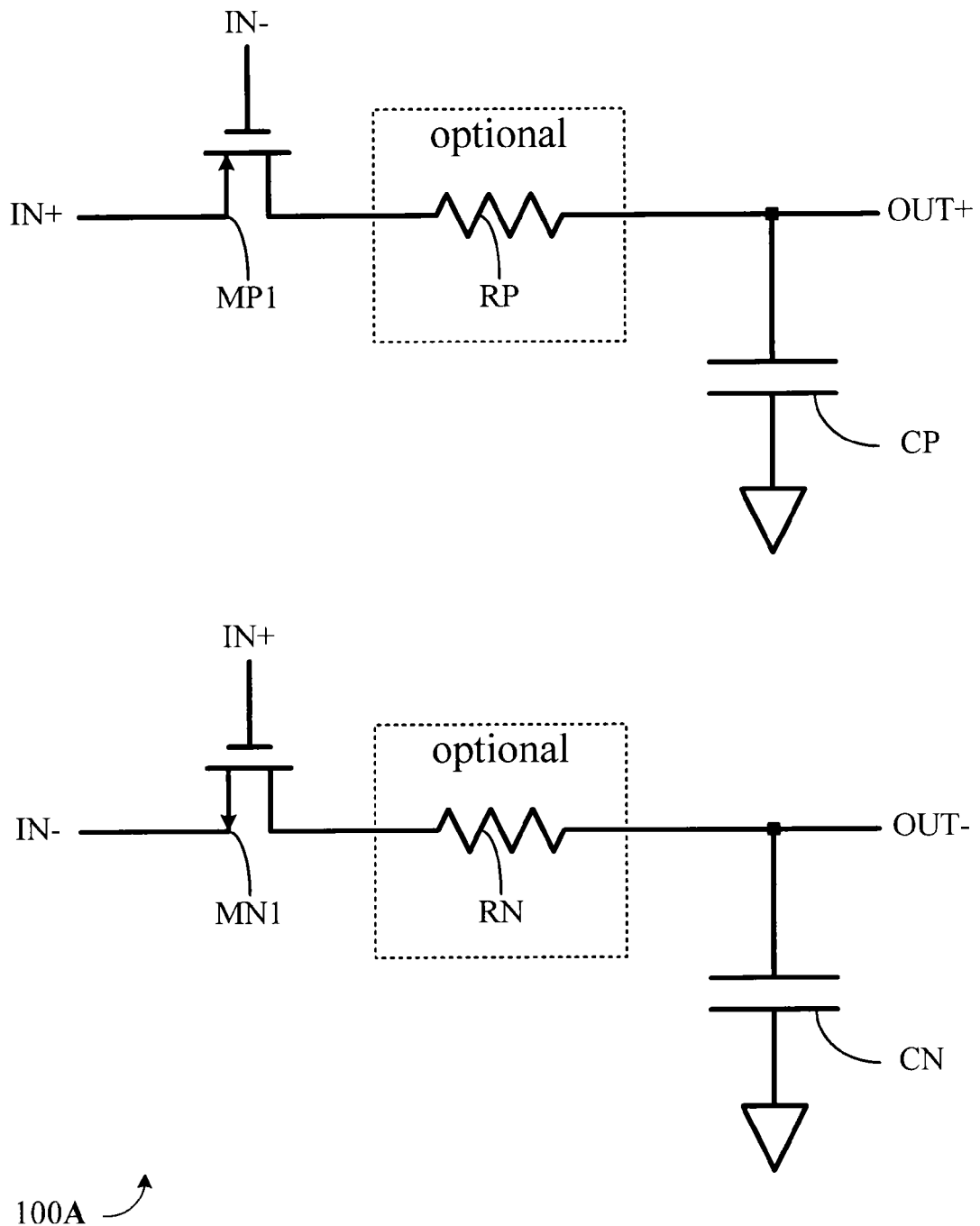
FIG. 1 shows a schematic diagram of an embodiment of a received signal strength indicator.

In an embodiment, an apparatus comprises: a PMOS (p-channel metal-oxide semiconductor) transistor, a NMOS (n-channel metal-oxide semiconductor) transistor, a first capacitor, and a second capacitor, wherein: a first terminal of the PMOS transistor is coupled to a first signal; a second terminal of the PMOS transistor is coupled to a second signal; a third terminal of the PMOS transistor is coupled to the first capacitor; a first terminal of the NMOS transistor is coupled to the second signal; a second terminal of NMOS transistor is coupled to the first signal; and a third terminal of the NMOS transistor is coupled to the second capacitor.

In another embodiment, an apparatus comprises: a first PMOS (p-channel metal-oxide semiconductor) transistor, a second PMOS transistor, a first NMOS (n-channel metal-oxide semiconductor) transistor, a second NMOS transistor, a first capacitor, and a second capacitor, wherein: a first terminal of the first PMOS transistor is coupled to a first signal; a second terminal of the first PMOS transistor is coupled to a second signal; a third terminal of the first PMOS transistor is coupled to the first capacitor; a first terminal of the second PMOS transistor is coupled to the second signal; a second terminal of the second PMOS transistor is coupled to the first signal; a third terminal of the second PMOS transistor is coupled to the third terminal of the first PMOS transistor; a first terminal of the first NMOS transistor is coupled to the second signal; a second terminal of the first NMOS transistor is coupled to the first signal; a third terminal of the first NMOS transistor is coupled to the second capacitor; a first terminal of the second NMOS transistor is coupled to the first signal; a second terminal of the second NMOS transistor is coupled to the second signal; and a third terminal of the second NMOS transistor is coupled to the third terminal of the first NMOS transistor.

In yet another embodiment, a method comprises: receiving a first signal; receiving a second signal; coupling the first signal to a first terminal of a first PMOS transistor; coupling the second signal to a second terminal of the first PMOS transistor; coupling a first capacitor to a third terminal of the first PMOS transistor; coupling the second signal to a first terminal of a first NMOS transistor; coupling the first signal to a second terminal of the first NMOS transistor; and coupling a second capacitor to a third terminal of the first NMOS transistor.

In a further embodiment the method further comprises: coupling the second signal to a first terminal of a second PMOS transistor; coupling the first signal to a second terminal of the second PMOS transistor; coupling a third terminal of the second PMOS transistor to the third terminal of the first PMOS transistor; coupling the first signal to a first terminal of a second NMOS transistor; coupling the second signal to a second terminal of the second NMOS transistor; and coupling a third terminal of the second NMOS transistor to the third terminal of the first NMOS transistor.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

An embodiment 100 of a received signal strength indicator is depicted in FIG. 1. Throughout this disclosure, differential signaling is used, where a signal is defined as a difference between a first signal (referred to as the "+" signal) and a second signal (referred to as the "−" signal). To be specific, an input signal (i.e., received signal) is defined as the difference between IN+ and IN−, where IN+ and IN− are the first signal and the second signal of the input signal of the received signal strength indicator, respectively. Likewise, an output signal is defined as the difference between OUT+ and OUT−, where OUT+ and OUT− are the first signal and the second signal of the output signal of the received signal strength indicator, respectively.

Embodiment 100 comprises: a first PMOS (p-channel metal-oxide semiconductor) transistor MP1, a first capacitor CP, a first NMOS (n-channel metal-oxide semiconductor) transistor MN1, and a second capacitor CN. A MOS transistor (either NMOS or PMOS) is a symmetrical device and comprises a first terminal, a second terminal and a third terminal. The second terminal is referred to as the "gate." The first terminal and the third terminal are referred to as the "source" and the "drain," respectively. However, a MOS transistor is a symmetrical device and therefore there is no difference in nature between the "source" and the "drain." The source and the gate the first PMOS transistor MP1 are coupled to IN+ and IN−, respectively. The drain of the first PMOS transistor MP1 is coupled to the first capacitor CP via an optional resistor RP (which can be replaced by a short circuit). The source and the gate the first NMOS transistor MN1 are coupled to IN− and IN+, respectively. The drain of the first NMOS transistor MN1 is coupled to the second capacitor CN via an optional resistor RN (which can be replaced by a short circuit). When the input signal is positive, i.e. IN+ is higher than NI−, the first PMOS transistor MP1 is at least partially turned on and the first capacitor CP is effectively coupled to IN+, while the first NMOS transistor MN1 is at least partially turned on and the second capacitor CN is effectively coupled to IN−. When the input signal is negative, i.e. IN+ is lower than NI−, the first PMOS transistor MP1 is turned off and the first capacitor CP is effectively decoupled from IN+, while the first NMOS transistor MN1 is turned off and the second capacitor CN is effectively decoupled from IN−. In this manner, the first capacitor CP and the second capacitor CN are effectively coupled to IN+ and IN−, respectively, only when the input signal is positive (i.e. IN+ is higher than IN−). As a result, OUT+ and OUT− are set to follow IN+ and IN−, respectively, during the positive half of the input signal. The output signal, defined as the difference between OUT+ and OUT−, is thus set to follow the input signal during the positive half of the input signal. Rectification is therefore effectively achieved.

Figure 2:
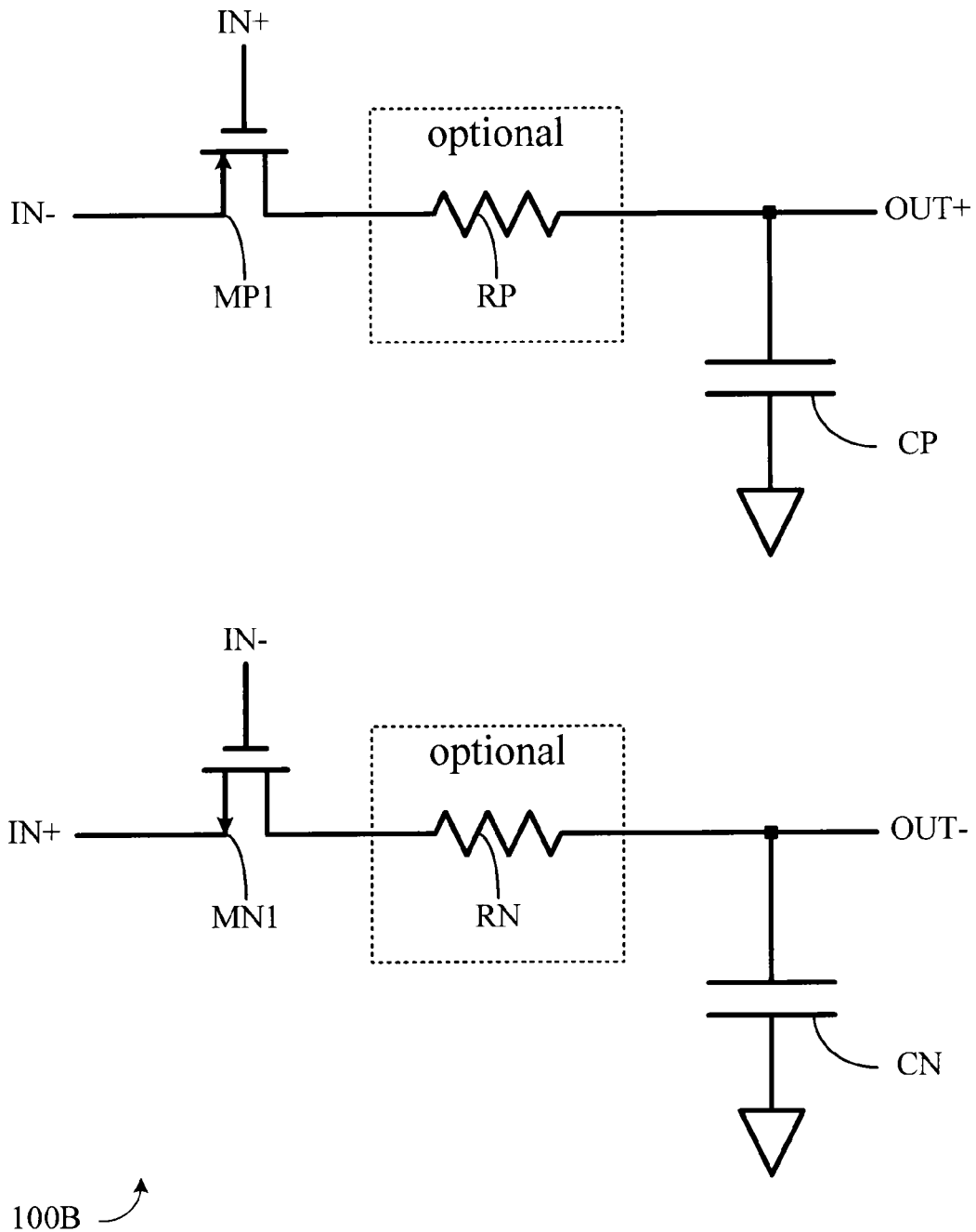
FIG. 2 shows a schematic diagram of an alternative embodiment of a received signal strength indicator.

An alternative embodiment 200 is depicted in FIG. 2. Embodiment 200 is identical with embodiment 100 of FIG. 1 except for the following arrangements: the source and the gate the first PMOS transistor MP1 are coupled to the IN− and IN+, respectively; and the source and the gate the first NMOS transistor MN1 are coupled to the IN+ and IN−, respectively. Using these arrangements, OUT+ and OUT− are set to follow IN− and IN+, respectively, during the negative half of the input signal where IN+ is lower than IN−. The output signal, defined as the difference between OUT+ and OUT−, is thus set to follow an inversion of the input signal during the negative half of the input signal. Rectification is therefore effectively achieved.

Figure 3:
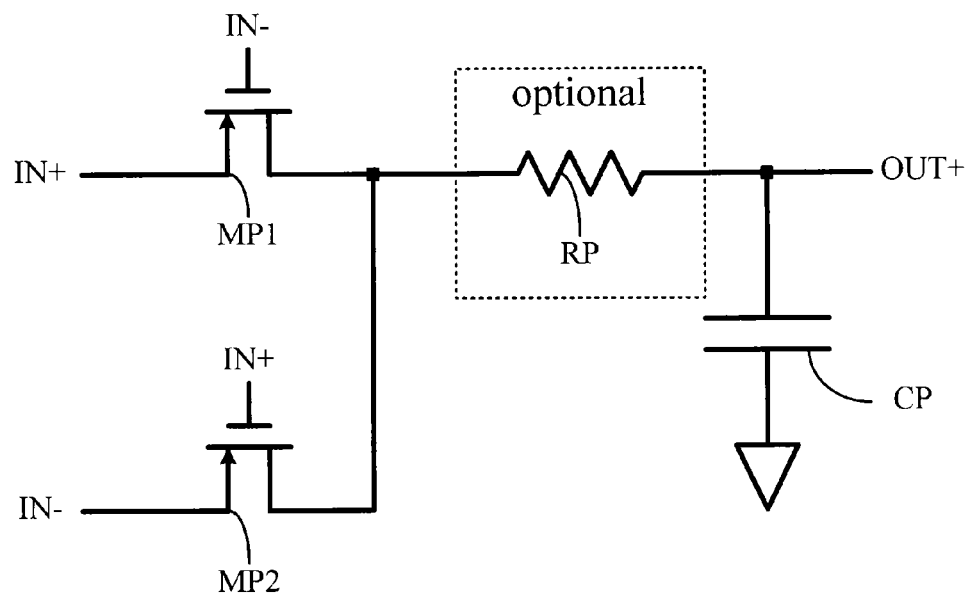
FIG. 3 shows a schematic diagram of yet another embodiment of a received signal strength indicator.
Figure 3:
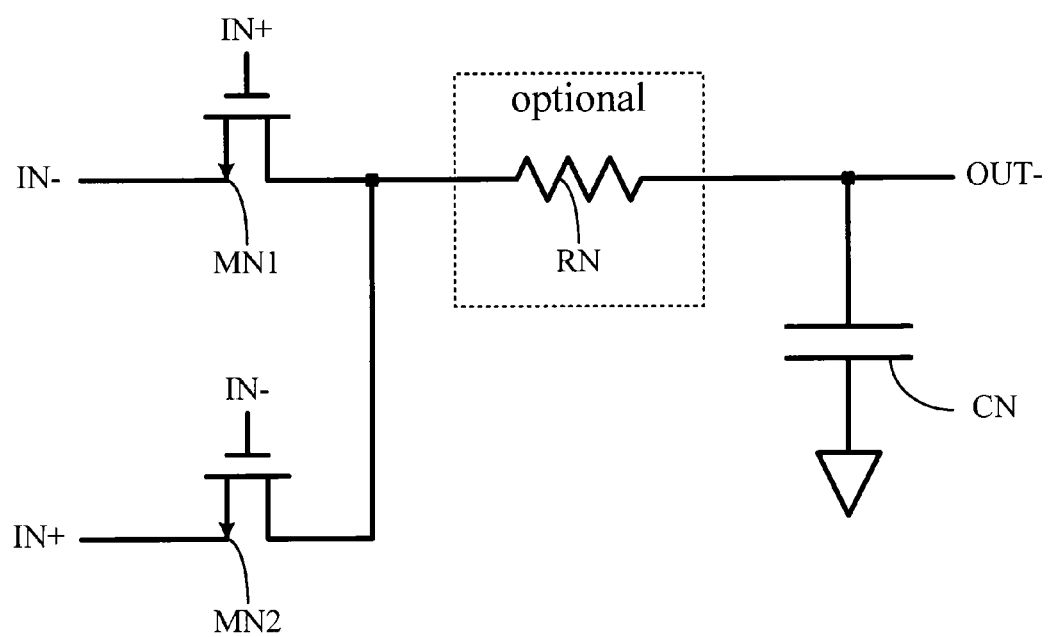

Yet another embodiment 300 is depicted in FIG. 3. Embodiment 300 is a combination of embodiment 100 of FIG. 1 and embodiment 200 of FIG. 2. Embodiment 300 comprises: a first PMOS transistor MP1, a second PMOS transistor MP2, a first capacitor CP, a first NMOS transistor MN1, a second NMOS transistor MN2, and a second capacitor CN. The source and the gate the first PMOS transistor MP1 are coupled to the IN+ and IN−, respectively. The drain of the first PMOS transistor MP1 is coupled to the first capacitor CP via an optional resistor RP. The source and the gate the second PMOS transistor MP2 are coupled to the IN− and IN+, respectively. The drain of the second PMOS transistor MP2 is coupled to the first capacitor CP via the optional resistor RP. The source and the gate the first NMOS transistor MN1 are coupled to the IN− and IN+, respectively. The drain of the first NMOS transistor MN1 is coupled to the second capacitor CN via an optional resistor RN. The source and the gate the second NMOS transistor MN2 are coupled to IN+ and IN−, respectively. The drain of the second NMOS transistor MN2 is coupled to the second capacitor CN via the optional resistor RN. In these arrangements, OUT+ and OUT− are set to follow IN+ and IN−, respectively, during the positive half of the input signal, and to follow IN− and IN+, respectively, during the negative half of the input signal. The output signal, defined as the difference between OUT+ and OUT−, is thus set to follow the input signal during the positive half of the input signal, and to follow an inversion of the input signal during the negative half of the input signal. Rectification is therefore effectively achieved.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus comprising:
    a first transistor having a first terminal coupled to a first signal and a second terminal coupled to a second signal;
    a second transistor;
    a first capacitor, and
    a second capacitor, wherein:
        a third terminal of the first transistor is coupled to the first capacitor;
        a first terminal of the second transistor is coupled to the second signal;
        a second terminal of the second transistor is coupled to the first signal;
        a third terminal of the second transistor is coupled to the second capacitor; and
    wherein when the first signal is greater than the second signal, the first transistor and the second transistor are at least partially turned on, the first capacitor is coupled to the first signal, and the second capacitor is coupled to the second signal.

2. The apparatus of claim 1 further comprising a resistor inserted between the third terminal of the first transistor and the first capacitor.

3. The apparatus of claim 1 further comprising a resistor inserted between the third terminal of the second transistor and the second capacitor.

4. The apparatus of claim 1, wherein an output signal is comprised of a voltage difference between the first capacitor and the second capacitor.

5. An apparatus comprising:
    a first PMOS (p-channel metal-oxide semiconductor) transistor;
    a second PMOS transistor;
    a first NMOS (n-channel metal-oxide semiconductor) transistor;
    a second NMOS transistor;
    a first capacitor; and
    a second capacitor, wherein:
        a first terminal of the first PMOS transistor is coupled to a first signal;
        a second terminal of the first PMOS transistor is coupled to a second signal;
        a third terminal of the first PMOS transistor is coupled to the first capacitor;
        a first terminal of the second PMOS transistor is coupled to the second signal;
        a second terminal of the second PMOS transistor is coupled to the first signal;
        a third terminal of the second PMOS transistor is coupled to the third terminal of the first PMOS transistor;
        a first terminal of the first NMOS transistor is coupled to the second signal;
        a second terminal of the first NMOS transistor is coupled to the first signal;
        a third terminal of the first NMOS transistor is coupled to the second capacitor;
        a first terminal of the second NMOS transistor is coupled to the first signal;
        a second terminal of the second NMOS transistor is coupled to the second signal; and
        a third terminal of the second NMOS transistor is coupled to the third terminal of the first NMOS transistor.

6. The apparatus of claim 5 further comprising a resistor inserted between the third terminal of the first PMOS transistor and the first capacitor.

7. The apparatus of claim 5 further comprising a resistor inserted between the third terminal of the first NMOS transistor and the second capacitor.

8. The apparatus of claim 5, wherein an output signal is comprised of a voltage difference between the first capacitor and the second capacitor.

9. A method comprising:
receiving a first signal;
receiving a second signal;
coupling the first signal to a first terminal of a first PMOS transistor;
coupling the second signal to a second terminal of the first PMOS transistor;
coupling a first capacitor to a third terminal of the first PMOS transistor;
coupling the second signal to a first terminal of a first NMOS transistor;
coupling the first signal to a second terminal of the first NMOS transistor; and
coupling a second capacitor to a third terminal of the first NMOS transistor;
wherein when the first signal is greater than the second signal, the first PMOS transistor and the first NMOS transistor are at least partially turned on, the first capacitor is coupled to the first signal, and the second capacitor is coupled to the second signal.

10. The method of claim 9 further comprising inserting a resistor between the third terminal of the first PMOS transistor and the first capacitor.

11. The method of claim 9 further comprising inserting a resistor between the third terminal of the first NMOS transistor and the second capacitor.

12. The method of claim 9 further comprising:
coupling the second signal to a first terminal of a second PMOS transistor;
coupling the first signal to a second terminal of the second PMOS transistor;
coupling a third terminal of the second PMOS transistor to the third terminal of the first PMOS transistor;
coupling the first signal to a first terminal of a second NMOS transistor;
coupling the second signal to a second terminal of the second NMOS transistor; and
coupling a third terminal of the second NMOS transistor to the third terminal of the first NMOS transistor.

13. The apparatus of claim 1, wherein the first terminal of the first transistor comprises a source terminal of the first transistor, the second terminal of the first transistor comprises a gate terminal of the first transistor, and the third terminal of the first transistor comprises a drain terminal of the first transistor.

14. The apparatus of claim 1, wherein when the first signal is less than the second signal, the first transistor and the second transistor are turned off, the first capacitor is effectively decoupled from the first signal, and the second capacitor is effectively decoupled from the second signal.

15. The apparatus of claim 1, wherein an input signal received by the apparatus comprises the first signal and the second signal.

16. An apparatus comprising:
a first transistor having a first terminal coupled to a first signal and a second terminal coupled to a second signal, wherein an input signal corresponds to a difference between the first signal and the second signal;
a second transistor;
a first capacitor, and
a second capacitor, wherein:
a third terminal of the first transistor is coupled to the first capacitor;
a first terminal of the second transistor is coupled to the second signal of the input signal;
a second terminal of second transistor is coupled to the first signal of the input signal; and
a third terminal of the second transistor is coupled to the second capacitor, wherein when the first signal is less than the second signal, the first capacitor is decoupled from the first signal, and the second capacitor is decoupled from the second signal.

17. The apparatus of claim 16, wherein when the first signal is greater than the second signal, the first transistor and the second transistor are at least partially turned on, the first capacitor is coupled to the first signal, and the second capacitor is coupled to the second signal.

18. A method comprising:
receiving a first signal;
receiving a second signal, wherein an input signal corresponds to a difference between the first signal and the second signal;
coupling the first signal to a first terminal of a first transistor;
coupling the second signal to a second terminal of the first transistor;
coupling a first capacitor to a third terminal of the first transistor;
coupling the second signal to a first terminal of a second transistor;
coupling the first signal to a second terminal of the second transistor; and
coupling a second capacitor to a third terminal of the second transistor, wherein when the first signal is less than the second signal, the first capacitor is decoupled from the first signal, and the second capacitor is decoupled from the second signal.

19. The method of claim 18, wherein when the first signal is greater than the second signal, the first transistor and the second transistor are at least partially turned on, the first capacitor is coupled to the first signal, and the second capacitor is coupled to the second signal.

20. The method of claim 18, wherein the first terminal of the first transistor comprises a source terminal of the first transistor, the second terminal of the first transistor comprises a gate terminal of the first transistor, and the third terminal of the first transistor comprises a drain terminal of the first transistor.

* * * * *